(12) United States Patent
Börner et al.

(10) Patent No.: US 7,897,977 B2
(45) Date of Patent: Mar. 1, 2011

(54) SEMICONDUCTOR COMPONENT EMITTING ELECTROMAGNETIC RADIATION AND COMPONENT HOUSING

(75) Inventors: Mike Börner, Regensburg (DE); Frank Möllmer, Matting b. Pentling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 767 days.

(21) Appl. No.: 11/577,526

(22) PCT Filed: Oct. 25, 2005

(86) PCT No.: PCT/DE2005/001909
§ 371 (c)(1),
(2), (4) Date: Aug. 15, 2007

(87) PCT Pub. No.: WO2006/045287
PCT Pub. Date: May 4, 2006

(65) Prior Publication Data
US 2008/0105886 A1  May 8, 2008

(30) Foreign Application Priority Data

Oct. 25, 2004 (DE) .................. 10 2004 051 921
Jun. 21, 2005 (DE) .................. 10 2005 028 748

(51) Int. Cl.
*H01L 27/15* (2006.01)
*H01L 29/26* (2006.01)
*H01L 31/12* (2006.01)
*H01L 33/00* (2006.01)

(52) U.S. Cl. ................... 257/80; 257/81; 257/98
(58) Field of Classification Search ............. 257/80–82, 257/98, 99, 432, 433
See application file for complete search history.

(56) References Cited

U.S. PATENT DOCUMENTS

| 5,813,753 | A  | * | 9/1998  | Vriens et al. ............... 362/293 |
| 6,069,440 | A  | * | 5/2000  | Shimizu et al. ............. 313/486 |
| 6,137,121 | A  |   | 10/2000 | Yamamoto et al. |
| 6,417,019 | B1 | * | 7/2002  | Mueller et al. ............... 438/29 |
| 6,521,915 | B2 | * | 2/2003  | Odaki et al. .................. 257/98 |
| 6,545,455 | B2 |   | 4/2003  | Saito |

(Continued)

FOREIGN PATENT DOCUMENTS

CN    2426640    4/2001

(Continued)

OTHER PUBLICATIONS

Ishinaga, Hirok, "Light Emitting Semiconductor Device has an Epoxy Resin Encapsulation of Low Glass Transition Temperature to Reduce Crack-Inducing Thermal Stresses on Surface Mounting of the Devce e.g. on a Wiring Board",Machine English Translation of DE 199 45 919 A 1, Mar. 30, 2003.*

(Continued)

*Primary Examiner* — Zandra Smith
*Assistant Examiner* — Telly D Green
(74) *Attorney, Agent, or Firm* — Fish & Richardson P.C.

(57) ABSTRACT

An optoelectronic component includes a component housing and a body comprising a carrier substrate and a radiation emitting layer sequence. In certain embodiments, the body is arranged in a reflector cup of the component housing and is electrically conductively connected to external electrical leads of the component housing. The component housing can also be further provided with a lens that produces a desired aperture angle for the radiation cone. Uses for the component are also described.

28 Claims, 7 Drawing Sheets

U.S. PATENT DOCUMENTS

| | | | |
|---|---|---|---|
| 6,683,325 B2 | 1/2004 | Waitl et al. | |
| 6,849,881 B1 | 2/2005 | Harle et al. | |
| 2004/0041222 A1 | 3/2004 | Loh | |
| 2004/0245912 A1* | 12/2004 | Thurk et al. | 313/484 |
| 2006/0044806 A1* | 3/2006 | Abramov et al. | 362/337 |
| 2006/0279955 A1* | 12/2006 | Kettunen et al. | 362/362 |

FOREIGN PATENT DOCUMENTS

| | | |
|---|---|---|
| DE | 19945919 | 3/2000 |
| DE | 10026255 | 11/2001 |
| DE | 10243421 | 4/2004 |
| DE | 10345516 | 5/2005 |
| WO | WO 01/39282 | 5/2001 |

OTHER PUBLICATIONS

International Preliminary Report on Patentability for International Application No. PCT/DE2005/001909 dated Jun. 14, 2007.

First Office Action for Chinese Application No. 200580036291.9 dated Jun. 6, 2008.

Authorized officer: Hedouin, M., International Search Report, PCT/DE2005/001909; Apr. 10, 2006.

Schnitzer, I. et al., "30% External Quantum Efficiency from Surface Textured, Thin-film Light-emitting Diodes", *Appl. Phys. Lett.*, vol. 63, No. 16, pp. 2174-2176, 1993.

Taiwanese Search Report, Application No. 94136865, Mar. 1, 2007.

* cited by examiner

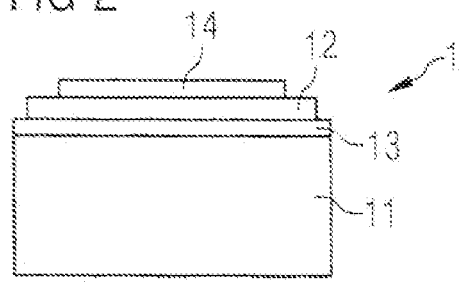
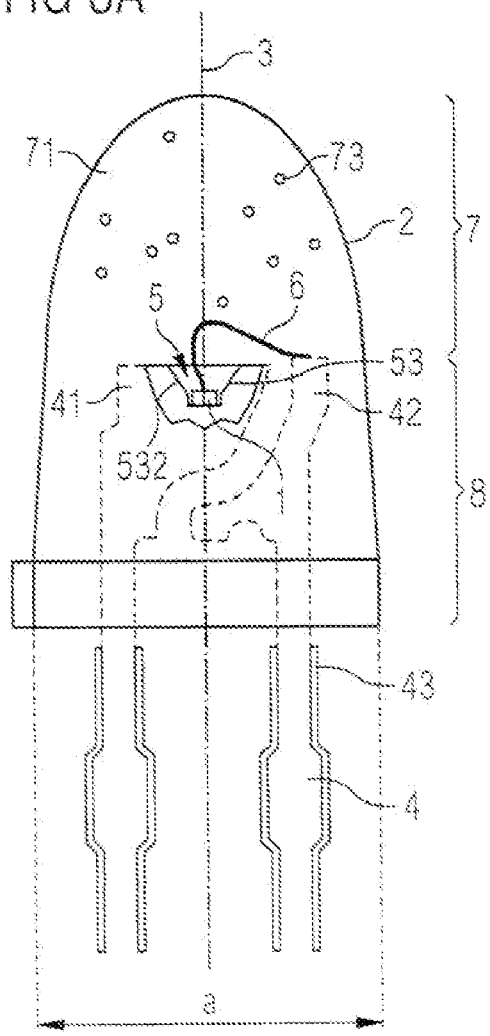

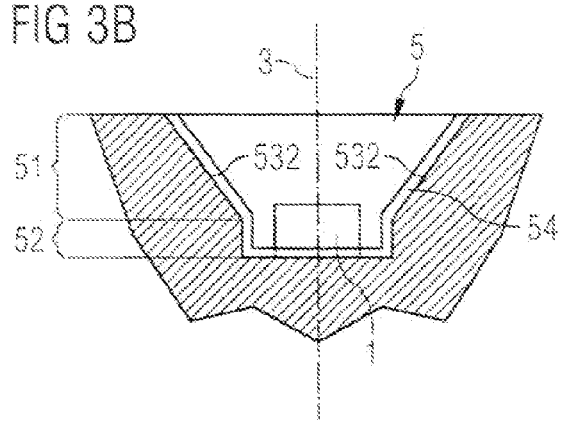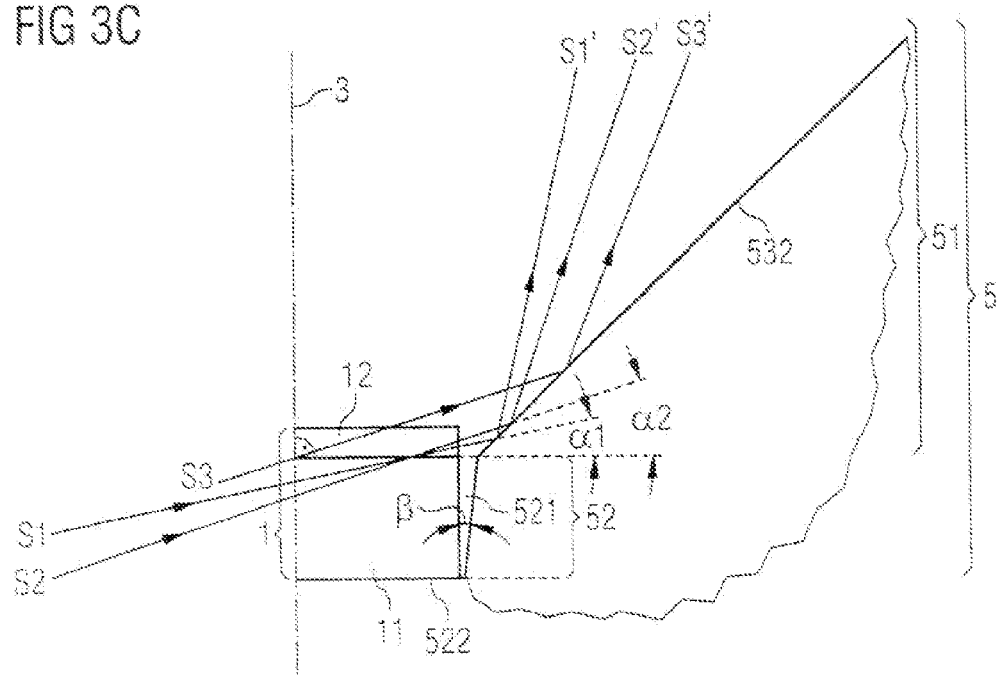

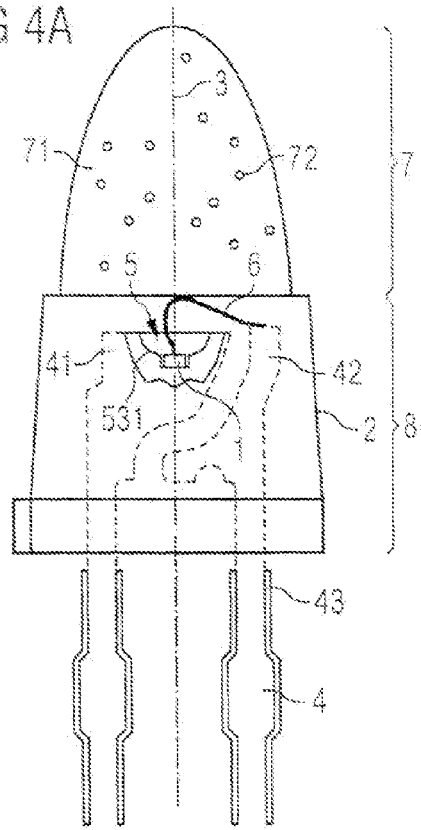
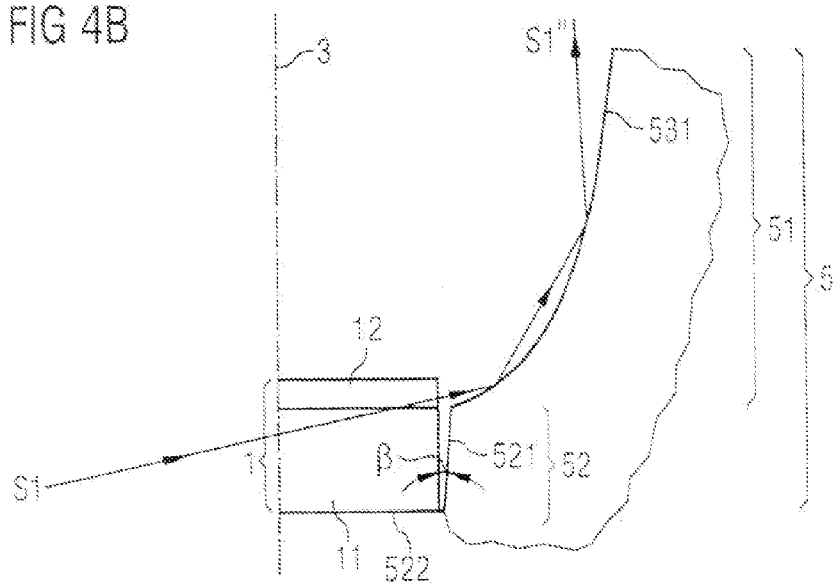

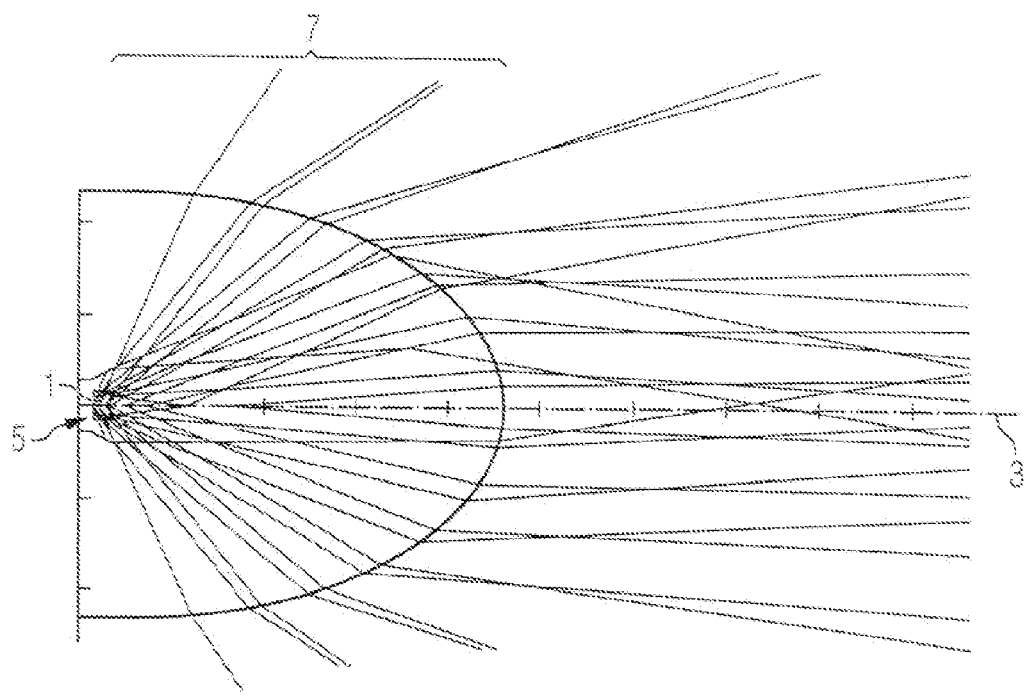

SEMICONDUCTOR COMPONENT EMITTING ELECTROMAGNETIC RADIATION AND COMPONENT HOUSING

CROSS-REFERENCE TO RELATED APPLICATIONS

This application is the National Stage of International Application No. PCT/DE2005/001909, filed on Oct. 25, 2005, which claims the priority to German Patent Applications Serial No. 10 2004051921.8, filed on Oct. 25, 2004 and Serial No. 10 2005028748.4, filed on Jun. 21, 2005. The contents of all applications are hereby incorporated by reference in their entireties.

Electromagnetic radiation emiting semiconductor component and component housing

FIELD OF THE INVENTION

The disclosure relates to an electromagnetic radiation emitting semiconductor component which is suitable for emitting electromagnetic radiation and a component housing for a radiation-emitting body, particularly for a thin-film semiconductor chip.

BACKGROUND OF THE INVENTION

The ongoing development of new chip technologies in the field of light-emitting diodes (LEDs) is a major factor prompting the use of new optical elements in housing technology.

A so-called thin-film LED chip (for a more detailed description, see below) emits about 85% of its radiation from the top of the chip, that is, from a front side of a radiation-generating semiconductor layer sequence, facing away from a carrier substrate. The remaining 15% is emitted to the side, through the flanks of the semiconductor layer sequence.

A thin-film LED chip is distinguished in particular by the following characteristic features:

a reflective layer is applied to or formed on a first main face, turned toward a carrier element, of a radiation-generating epitaxial layer sequence and reflects at least a portion of the electromagnetic radiation generated in the epitaxial layer sequence back thereinto; and the epitaxial layer sequence has a thickness in the range of 20 μm or less, particularly in the range of 10 μm.

The epitaxial layer sequence further preferably contains at least one semiconductor layer with at least one area having an intermixing structure that ideally leads to an approximately ergodic distribution of the radiation in the epitaxial layer sequence, i.e., it has an isofar as possible ergodically stochastic scattering behavior.

A basic principle of a thin-film LED chip is described for example in I. Schnitzer et al., Appl. Phys. Lett. 63(16), Oct. 18, 1993, 2174-2176, whose disclosure content in this regard is hereby incorporated by reference.

A thin-film LED chip is, as a good approximation, a Lambertian surface emitter, and is therefore particularly well suited for use in a floodlight.

To realize an optoelectronic component employing such a thin-film LED chip and yielding a definedly narrow emission angle and the highest possible radiant power, a radiation emitted laterally at a shallow angle from the front side and the radiation emitted laterally through the flanks of the semiconductor layer sequence must be deflected as completely as possible toward the desired optical axis of the component and into the desired emission cone of the component, so that this radiation is also emitted from the component within the desired, definedly narrow angle.

SUMMARY OF THE INVENTION

It is, therefore, an object of the present invention to provide a component housing with which a defined emission angle of the desired optoelectronic component can be obtained by means of a thin-film LED chip or a body that emits electromagnetic radiation having a similar emission characteristic.

The disclosure content of the claims is hereby expressly incorporated into the description.

A component housing for an optoelectronic component with a radiation emitting body according to the invention includes in particular a reflector cup comprising:

a reflector region (51) with an inner surface whose cross section increases as viewed from the radiation emitting body (1) to a front side of the component housing (2), such that radiation coming from the layer sequence and striking the inner surface (53) is deflected specifically to a desired optical axis (3) of the component, and a substrate trough (52), which is disposed upstream on the floor side of the reflector region (51) and in which the radiation emitting body (1) is arranged, the depth of the substrate trough being so selected that the carrier substrate is at least partially sunken relative to the reflector region and the length and the width of the substrate trough being so adapted to the length and the width of the body that only minuscule gaps exist between the flanks of the body and the substrate trough.

The "front side" of the component or of the component housing denotes hereinbelow that side of the component or component housing through which the preponderance of the generated radiation is emitted during operation. The "floor" of the component or component housing denotes that side of the component or component housing which is disposed opposite the front side. By extension, the side of the radiation emitting body from which a preponderance of the radiation is emitted during operation is also identified as the front side. The back side of the body is the side opposite the front side.

The circumstance that "only minuscule gaps exist between the flanks of the body and the substrate trough" is understood herein to mean that the clear widths of the substrate trough are usefully only slightly larger than the lateral dimensions of the chip, such that, for example, the chip can still be inserted and mounted in the substrate trough by means of conventional implements, such as for example pick and place equipment, but there is no residual space. In a preferred embodiment, the distance of the side walls of the substrate trough from the flanks of the radiation emitting body is between about 0.05 and 0.3 mm, preferably between 0.1 and 0.15 mm, limits included in each case. Particularly preferably, the size of the gap is approximately 100 μm.

Owing to the shape of the reflector cup (a deep-set floor of a substrate trough, with dimensions adapted to the chip, and a reflector region disposed thereafter in the emission direction of the radiation emitting body), it is possible to bring the inner surfaces of the reflector region very close to the radiation emitting region of the body, that is, to the radiation emitting layer sequence. The side walls of the substrate trough need only be arranged close enough to the chip flanks so that only minuscule gaps exist between the flanks of the chip and the substrate trough.

This makes it possible for radiation exiting the top of the emitter at a shallow angle to be deflected forwardly toward the emission direction, very close against the chip, by means of the reflector cup.

In a preferred embodiment, the inner surfaces of the reflector region are provided with a reflective layer that for example comprises silver. This advantageously increases the reflectivity of the inner surfaces. Depending on the wavelength range of the radiation emitted by the body, other materials may also be suitable for increasing the reflectivity of the inner surfaces of the reflector region.

A thin-film LED chip is preferably mounted as a radiation source in the component housing. In that case, the thin-film LED chip is arranged in the substrate trough such that its carrier substrate faces the floor of the housing component.

The inner surface of the reflector region can advantageously be configured as a paraboloid. The efficiency of the reflector cup can be improved in this way.

In particular, in the present case a reflector region with a parabolic inner surface deflects toward the optical axis a particularly large fraction of the radiation exiting the top of the radiation-emitting body at a shallow angle, and is therefore particularly suitable for bundling the radiation. In the present context, "at a shallow angle" means that the radiation forms a small angle α with the front side of the radiation emitting body.

The inner surface of the reflector region can further also be configured as truncated-cone-shaped. A truncated-cone-shaped inner surface of the reflector region is easier to create than a parabolic inner surface. In addition, a reflector region with a truncated-cone-shaped inner surface is particularly suitable for producing an illumination field with a uniform radiation density.

In a further embodiment, the reflector region has a spherical inner surface. A reflector region with a spherically shaped inner surface is particularly suitable for obtaining emission angles in the range between 15° and 30°.

In a particularly preferred embodiment, the component housing comprises a lens, which is disposed after the reflector region as viewed from the floor of the component housing. The lens effects a bundling of the direct front radiation and the shallow surface radiation reflected by the reflector region. By means of the lens, the emission characteristic of an optoelectronic component can be specifically adapted to the component housing.

The lens can be designed for example to deliberately yield a desired aperture angle of the emission cone of the optoelectronic component.

In one embodiment the lens is an aspherical lens, preferably having the shape of an ellipsoid segment, since even off-axis radiation can usually be bundled well with a lens of this kind. The term "off-axis radiation" is understood herein to mean radiation that does not pass in the direct vicinity of the optical axis of the optoelectronic component. This allows the dimensions of the lens to be reduced further in comparison to spherical lenses.

However, it is also conceivable for the lens to have another shape, for example one produced by rotating an arbitrary curve about the optical axis. The lens shape and the shape of the reflector region are advantageously adapted to each other such that the radiation emitted by the component is uniformly emitted in the desired angular range, thereby producing a uniformly illuminated illumination field with defined dimensions.

The combination of the reflector cup according to the invention and an aspherical lens permits very uniform illumination of a very small area in the near field with high irradiance. On this point, compare the lateral distribution of the simulated values of the relative radiant power (in %) of a component with an aspherical lens and a reflector region with a truncated-cone-shaped inner surface disposed 2 mm away from the lens, as illustrated in FIG. 1A. The "relative radiant power" is understood to be the radiant power normalized to the maximum value of the radiant power. In addition, in the graph of FIG. 1B the half aperture angle of the emission cone is plotted in degrees on the x-axis, and the relative radiant power corresponding to FIG. 1A on the y-axis.

As can be seen from FIG. 1B, a half-angle of 8.4° can be obtained with the combination of a lens and a reflector region with a truncated-cone-shaped inner surface. "Half-angle" is understood to mean the aperture angle of the emission cone at which the radiant power is equal to 50% of the value it has the front side of the radiation emitting body. Construction and subsequent measurements reveal that a half-angle of 7°, a radiant power Ie of 46 mW/sr (20 mA) and an irradiance PhiE of 7.6 mW (20 mA) can be obtained.

In a further embodiment, the lens is a Fersnel lens. A Fresnel lens advantageously permits a very flat construction for the structural housing and the component.

In addition, the lens can also have the shape of a non-rotationally-symmetrical ellipsoid segment. A "non-rotationally-symmetrical ellipsoid segment" is understood herein to mean a segment of an ellipsoid whose three axes have different lengths and which therefore cannot be generated by rotating a curve about the optical axis. Such a lens makes it possible to obtain an illumination field that has an asymmetrical shape, particularly an elliptical shape. Components with a lens in the form of a non-rotationally-symmetrical ellipsoid segment are used preferentially in large-format displays for stadiums or railway stations.

Through the interaction of a lens and a reflector cup, it is possible to guide nearly all the front radiation from a top-emitting radiation-source body, such as for example a thin-film LED chip, into a very narrow, homogeneously illuminated field.

The present reflector cup is suitable under these circumstances for bundling the largest possible fraction of the radiation emitted from the top of the body in such fashion that it is radiated from the downstream lens within an emission cone having a defined aperture angle. In a preferred embodiment, the aperture angle of the emission cone is as small as possible, so that the radiation is emitted substantially parallel to the optical axis of the component.

Such narrowly emitting and bright LED components are frequently and preferably used to uniformly irradiate relatively small areas, such as in an optical computer mouse, for example. In addition, LED components that emit radiation in the infrared wavelength range in the form of an emission cone with a very small aperture angle and at substantially uniform, high intensity are particularly suitable for use in light barriers and in feedback sensors in printers for aligning print heads and determining paper type. A further preferred application of the present LED components is data transmission in connection with multimedia applications in motor vehicles.

In one embodiment of the invention, the component housing further includes a truncated-cone-type pedestal region on which the lens is mounted. the transition between the lens and such a pedestal region can be tangential, or the lens can be set back relative to the pedestal, so that a shoulder is formed.

Particularly in the case of a so-called LED component of radial design, the transition of the lens into the rest of the housing body, for example into the pedestal region, can be configured as a step. "Radial design" is understood to be a design of the component that is substantially rotationally symmetrical to the optical axis of the component. In this way, the lens diameter can easily be made smaller than the diameter of the rest of the housing component. A lens whose diameter is smaller than the dimensions of the rest of the housing body can also be used with non-radial designs.

The substrate trough is preferably shaped in a truncated-cone-like manner, with a cross section that increases from its floor to the reflector region. A shape of this kind makes it possible to produce the reflector cup by stamping it from the leadframe, since the stamping tool can be withdrawn more readily [with this shape]. Particularly preferably, the side walls of the substrate trough form an angle β of about 1° with the surface normals to the floor of the substrate trough.

Further embodiments, improvements and advantages of the invention are described in more detail hereinbelow on the basis of three exemplary embodiments, taken in conjunction with FIGS. 2, 3A to 3C, 4A and 4B, 5A to 5D and 6A and 6B. Therein:

BRIEF DESCRIPTION OF THE DRAWINGS

FIG. 2 is a schematic sectional diagram of a thin-film semi-conductor chip;

FIG. 3A is a schematic sectional diagram of a component according to a first exemplary embodiment;

FIG. 3B is a schematic sectional diagram of the reflector cup of the first exemplary embodiment, enlarged from FIG. 3A;

FIG. 3C is a schematic sectional diagram of a partial enlargement of a reflector cup, illustrating the influence of the reflector region according to the first exemplary embodiment on the path of radiation forming a small angle α with the radiation-emitting top of the thin-film semiconductor chip;

FIG. 4A is a schematic sectional diagram of a component according to a second exemplary embodiment;

FIG. 4B is a schematic sectional diagram of a partial enlargement of a reflector cup, illustrating the influence of the reflector region according to the second exemplary embodiment on the path of radiation forming a small angle α with the radiation-emitting top of the thin-film semiconductor chip;

FIG. 5D is a schematic sectional diagram of the lens and the reflector region according to the first exemplary embodiment, showing the beam path for all emission directions of the chip;

DETAILED DESCRIPTION OF THE PREFERRED EMBODIMENTS

Figure 1A:
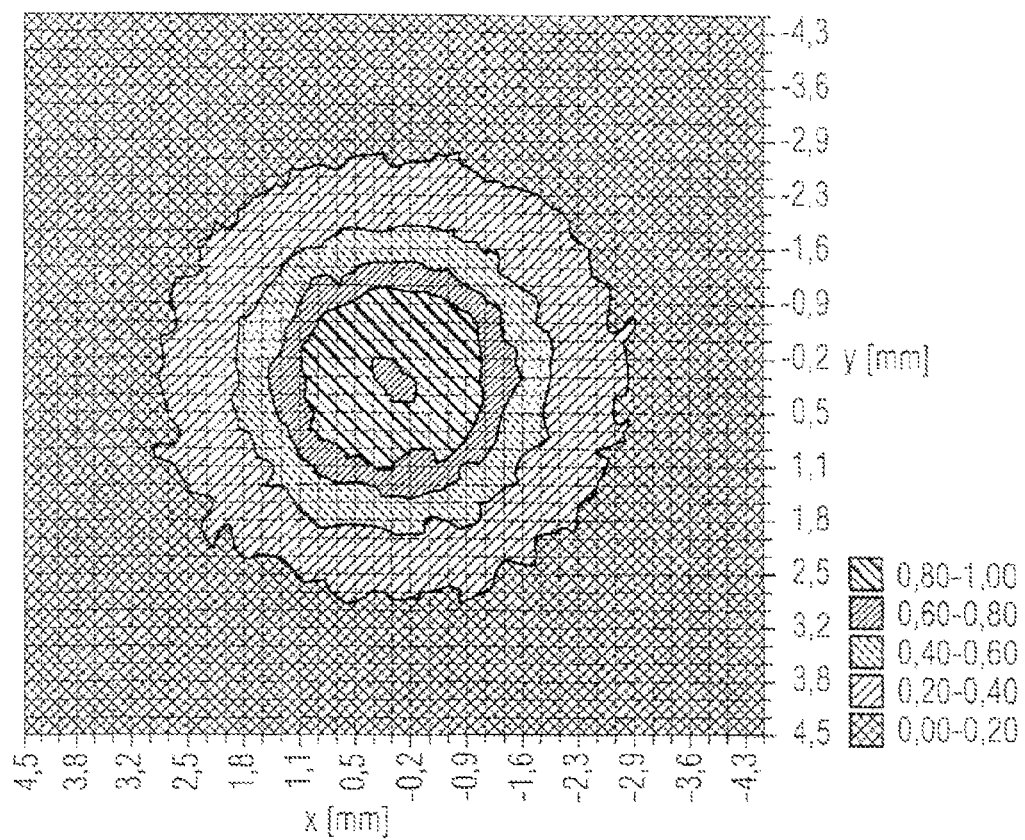
FIG. 1A shows simulated values of the relative radiant power of a component, in %.
Figure 1B:
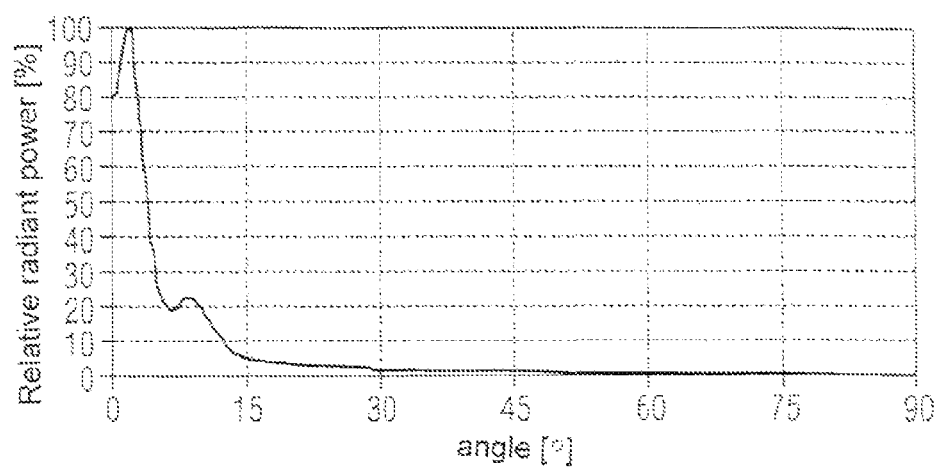
FIG. 1B shows the angle distribution of the simulated values of the relative radiant power from FIG. 1B.

The thin-film LED chip 1 according to FIG. 2 comprises for example an active thin-film layer stack 12, particularly based on $In_{1-x-y}Al_xGa_yP$ (where $0 \leq x \leq 1$, $0 \leq y \leq 1$ and $x+y \leq 1$), in which is formed a photon-emitting zone and a carrier substrate 11 for the thin-film layer stack 12, disposed on and bonded to a side of said thin-film layer stack 12 facing away from the emission direction of the chip 1. Such LED chips 1 are known to those versed in LED technology and will not be discussed further herein.

Thin-film layer stack 12 based on $In_{1-x-y}Al_xGa_yP$ (where $0 \leq x \leq 1$, $0 \leq y \leq 1$ and $x+y \leq 1$) means that the thin-film layer stack 12 comprises a plurality of layers composed of doped or undoped material from the system $In_{1-x-y}Al_xGa_yP$ (where $0 \leq x \leq 1$, $0 \leq y \leq 1$ and $x+y \leq 1$).

The thin-film layer stack 12 can further also be based on $In_{1-x-y}Al_xGa_yN$ (where $0 \leq x \leq 1$, $0 \leq y \leq 1$ and $x+y \leq 1$) or $In_{1-x-y}Al_xGa_yAs$ (where $0 \leq x \leq 1$, $0 \leq y \leq 1$ and $x+y \leq 1$). "Based on $In_{1-x-y}Al_xGa_yN$" (where $0 \leq x \leq 1$, $0 \leq y \leq 1$ and $x+y \leq 1$) or $In_{1-x-y}As$ (where $0 \leq x \leq 1$, $0 \leq y \leq 1$ and $x+y \leq 1$) means, equivalently to "$In_{1-x-y}Al_xGa_yP$," that the thin-film layer stack 12 comprises a plurality of layers composed of doped or undoped material from the respective systems $In_{1-x-y}Al_xGa_yN$ (where $0 \leq x \leq 1$, $0 \leq y \leq 1$ and $x+y \leq 1$) or $In_{1-x-y}Al_xGa_yAs$ (where $0 \leq x \leq 1$, $0 \leq y \leq 1$ and $x+y \leq 1$).

The thin-film layer stack 12 further includes a region suitable for generating photons, such as for example a pn junction or single or multiple quantum wells. A suitable InGaN-based thin-film layer stack 12 is described, for example in WO 01/39282 A2, whose disclosure content in this regard is hereby incorporated by reference.

The carrier substrate 11 is part of the semiconductor chip 1 per se and comprises mechanical supports for the thin-film layer stack 12, i.e., the essential bearing element for the thin-film layer stack 12, which itself has no further self-supporting layer on the side opposite the carrier substrate 11. Disposed between carrier substrate 11 and thin-film layer stack 12 is a reflective element 13, for example a reflective layer or layer sequence, that reflects radiation from the thin-film layer stack 12 to the radiation-emitting front side of the semiconductor chip 1. Carrier substrate 11 and reflective element 13 are in the present case electrically conductive, so that the thin-film semiconductor chip 1 can be electrically contacted from the back via the carrier substrate 11. For electrical contacting of the front side, an electrically conductive contact layer 14 is formed on the thin-film layer stack 12. It is further conceivable, for example if the carrier substrate 11 is electrically insulating, for the thin-film layer stack 12 to be provided on its front side with two separate electrical contacts, via each of which the thin-film semiconductor chip 1 is electrically conductively connected (not shown) by a respective bonding wire to respective lead elements 41, 42 of the leadframe 4. Embodiments of thin-film semiconductor chips 1 with two front-side contacts are known to those skilled in the art and therefore will not be discussed further herein.

The two exemplary embodiments according to FIGS. 3A to 3C and 4A and 4B represent so-called 5 mm radial designs, which are advantageously to be used in an optical computer mouse to illuminate the mouse pad to be detected.

A 5 mm radial design represents a component with a component housing 2 that has a substantially rotationally symmetrical shape with respect to an optical axis 3 of the component and whose outermost diameter α is 5 mm. Radial designs are also possible in which diameter α is smaller or larger, and is equal for example to 3 mm or 11 mm.

The component housing 2 includes a leadframe 4 with electrical lead elements 41, 42 and a reflector cup 5. The reflector cup 5 has a reflector region 51 shaped in a funnel-like manner and a substrate trough 52 disposed upstream on the floor side of the reflector region 51. The inner surface 53 of the reflector region 51 can be configured as truncated-cone-shaped, as illustrated in FIGS. 3A, 3B and 3C, or it can be parabolically shaped, as illustrated in FIGS. 4A and 4B.

The leadframe 4, except for the reflector cup 5, is punched from sheet metal. The reflector cup 5 is stamped into the leadframe 4 by means of a stamping tool having the inverse of the desired shape, for example a parabolic or truncated-cone-shaped inner surface for the reflector region 51, with a substrate trough 52 upstream on the floor side. The substrate trough 52 is preferably configured as truncated-cone-shaped in this case, since the canted side walls make it easier to withdraw the stamping tool. The material used for the leadframe 4 can be, for example, an alloy containing CuFe. To increase the reflectivity of the reflector region 51, at least the latter is provided with a silver layer 54. The silver layer 54 can be applied galvanically, for example.

The radiation-emitting thin-film chip 1, as illustrated for example in FIG. 2, is mounted, for example glued, in the substrate trough 52. The electrical contacting of the thin-film chip I depends on the geometrical arrangement of its contacts. If, for example, one of the electrical contacts is on the back side of thin-film semiconductor chip 1 and one contact is on the front side of thin-film semiconductor chip 1, then the back contact is electrically conductively connected to the leadframe 4 for example by die-bonding with an electrically conductive adhesive, and the front side is electrically conductively connected to the electrical lead element 42 of the leadframe 4 by a bonding wire 6. In the present case, the bonding wire 6 contains gold and forms a ball where it is connected to the chip 1 and a wedge where it is connected to the leadframe. Ball/wedge bonds are known to those skilled in the art and therefore will not be discussed further herein.

If the thin-film semiconductor chip 1 has both electrical contacts on the front side (not shown), then the thin-film semiconductor chip 1 can also be fixed in the substrate trough 52 by means of an electrically insulating adhesive, and each of the two contacts can be electrically conductively connected to the lead elements 41, 42 of the leadframe by a respective bonding wire 6.

So that the regions of the electrical lead element 41, 42 of the leadframe 4 protruding from the component housing 2 can be soldered, in the present case these regions are galvanically coated with a layer 43 containing tin.

The reflector region 51 acts primarily on the radiation-generating thin-film layer stack 12. The actual radiation-emitting region of the thin-film chip 1 is only a few μm thick and is applied to a comparatively thick carrier substrate 11, in this case 180 μm thick. The reflective layer 13 is arranged between the carrier substrate 11 and the thin-film layer stack 12 in such a way that almost no radiation is able to penetrate into the carrier substrate 11, but [the radiation] is in large part reflected forwardly or to the side by the reflective layer 13.

To efficiently reflect forwardly the lateral radiation and the radiation emitted at a shallow angle from the front side of the chip 1, the reflector cup 5 is disposed very snugly against the thin-film layer stack 12. This is made possible by the substrate trough 52 of the reflector cup 5, in which the thin-film chip 1 is partially sunk. In the present case, the depth of the substrate trough 42 was selected to be slightly smaller, at 160 μm, than the thickness of the carrier substrate 11 (180 μm), so that radiation emitted laterally and slightly rearwardly through the flanks of the thin-film layer stack 12 still also strikes the reflector region 51. The carrier substrate 11, which is non-functional in terms of radiation emission, is therefore effectively not within the region of action of the reflector region 51 proper.

Figure 5A:
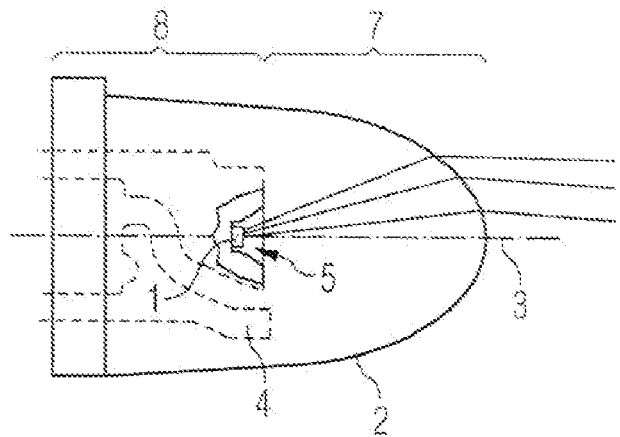
FIG. 5A is a schematic sectional diagram of the component according to the first exemplary embodiment, depicting the beam path of front-side top radiation from the thin-film LED chip that is emitted at a steep angle and is not deflected by the reflector region.
Figure 5B:
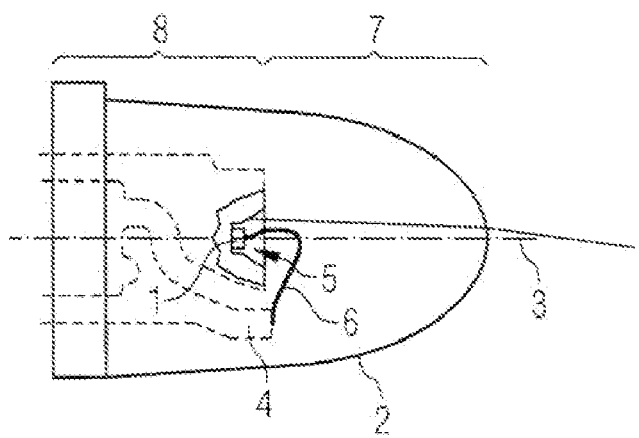
FIG. 5B is a schematic sectional diagram of the component according to the first exemplary embodiment, depicting the beam path of front-side top radiation from the thin-film LED chip that is emitted at a shallow angle and is deflected toward the optical axis of the component by the reflector region.
Figure 5C:
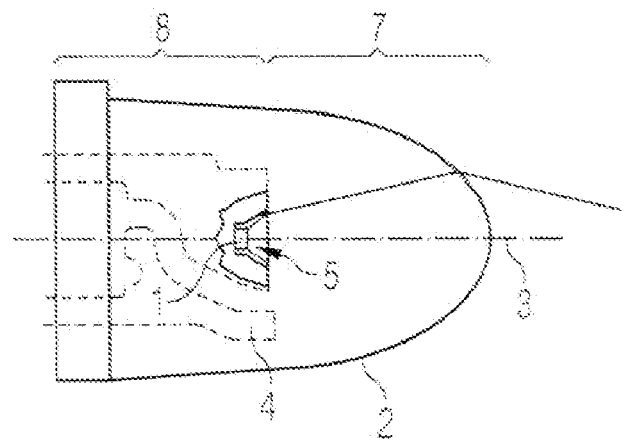
FIG. 5C is a schematic sectional diagram of the component according to the first exemplary embodiment, depicting the beam path of radiation from the thin-film LED chip that is emitted laterally through the chip flanks and is deflected toward the optical axis of the component by the reflector region.

This being the case, the reflector region 51 acts directly and at very close range on the radiation-generating layer of the chip 1, and can efficiently deflect toward the optical axis 3 the radiation exiting the top of the chip 1 at a shallow angle, i.e., radiation that forms a small angle α with the radiation-emitting top of the chip 1, and also the lateral radiation (through the chip flanks) (compare FIGS. 3C and 5B). Radiation emitted laterally through the flanks of the chip 1 is also deflected in the direction of optical axis 3 by reflector region 51 (compare FIGS. 3C and 5C).

In contrast to the first exemplary embodiment according to FIGS. 3A to 3C, the component of the second exemplary embodiment according to FIGS. 4A and 4B has a reflector region 51 with a parabolic inner surface 531. As can be seen from FIG. 4B, a parabolic inner surface 531 reflects (repeatedly, if necessary) radiation forming a small angle α with the radiation-emitting top of the chip 1, and thereby deflects it more strongly in the direction of the optical axis 3 (compare beam S1" reflected from the parabolic inner surface 531 with beam S1' reflected from truncated-cone-shaped inner surface 531 in FIG. 3C).

The side walls 521 of the substrate trough 52 form an angle β of about 1° with the normals to the floor surface 522 of the substrate trough 52. The distance of side walls 521 from the flanks of thin-film chip 1 is about 0.05 to 0.3 mm, preferably 0.1 to 0.15 mm.

An aspherical lens 7 is employed as the second optical element. This is disposed after the reflector cup 5 and the thin-film chip 1 in the direction of the front side of the component, and is located on a truncated-cone-like pedestal region 8 that encases the chip 1 and the reflector cup 5. The lens 7 is shaped such that radiation near the axis is collimated and the radiation deflected by the reflector region 52 is refracted more strongly in the direction of the optical axis 3 and thus becomes effective in the center of the radiation field of the component (compare FIGS. 5A to 5D).

The lens 7 has an elliptical shape in the present case, so that even off-axis beams are refracted toward the optical axis 3 such that a preponderance of the radiation emitted by the semiconductor chip 1 is bundled into a circumscribed region.

To fabricate the lens 7, the leadframe 4 with the mounted and electrically contacted chip 1 is positioned in a mold having the negative shape of the desired lens 7 and the adjacent pedestal region 8, and is potted in a suitable potting compound 71, such as for example an epoxy resin. To prevent an air bubble from forming in the reflector cup 5 during this process, before the potting operation the reflector cup 5 is wetted with the molding compound 71 in the mold, for example in a separate step wherein the reflector cup 5 is dipped in the potting compound 71. The lens 7 can be mounted on the pedestal region 8 such that it passes tangentially into the pedestal region 8 (compare FIG. 3A, for example) or is set back with respect to the pedestal region 8, so that a shoulder is formed (compare FIG. 4A, for example). In the latter case, lenses 7 whose diameters are not adapted to the diameter of the pedestal region 8 can also be used.

It is further conceivable for the potting compound 71 to contain pigments 72 that create or at least bolster the desired color impression of the optoelectronic component (compare FIG. 4A). Instead of pigments 72 that absorb the undesired portion of the radiation emitted by the chip 1, it is also conceivable to incorporate into the potting compound 71 luminescence conversion substances 73 that absorb a given spectral region of the radiation emitted by the chip, convert it into radiation of another, usually larger, wavelength, and re-emit it (compare FIG. 3A).

Figure 6A:
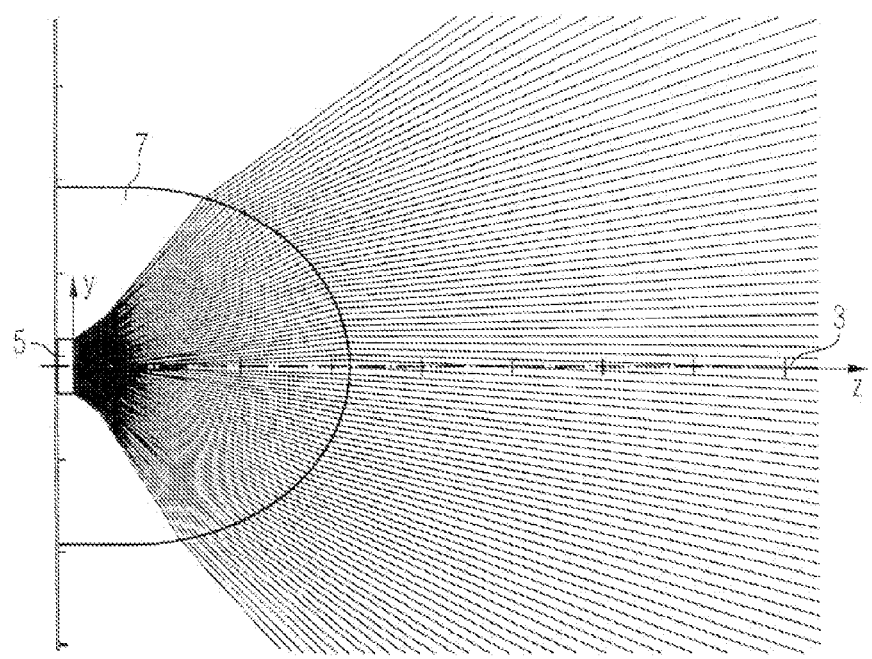
FIG. 6A is a schematic sectional diagram of the lens and the reflector region according to a third exemplary embodiment, showing the beam path in the xz-plane.
Figure 6B:
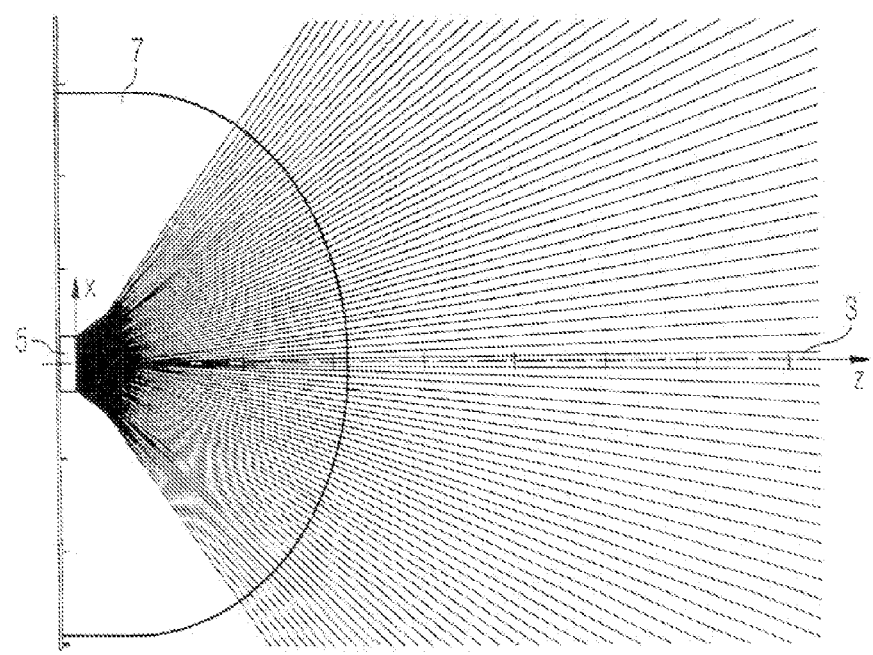
FIG. 6B is a schematic sectional diagram of the lens and the reflector region according to a third exemplary embodiment, showing the beam path in the yz-plane.

In contrast to the above-described exemplary embodiments, in the exemplary embodiment according to FIGS. 6A and 6B, the lens 7 of the component has the shape of a non-rotationally-symmetrical ellipsoid segment, which, unlike a rotationally symmetrical ellipsoid segment, has two semi-axes of different lengths, in the x-and y-directions. The optical axis 3 is here designated as the z-axis, while the x-axis and the y-axis each span a plane perpendicular to the z-axis containing the floor surface 522 of the substrate trough 52. The point of intersection of the x-axis, the y-axis and the z-axis is at the center of the floor surface 522 of the substrate trough 52.

According to the present exemplary embodiment, the lens 7 has a shorter semi-axis in the x-direction than in the y-direction, so that the aperture angle of the emission cone in the xz-plane (compare FIG. 6A) is smaller than the aperture angle of the emission cone in the yz-plane (compare FIG. 6B), thereby producing an asymmetrical illumination field.

The invention naturally is not limited to the exemplary embodiments by the description of it with reference thereto. Rather, the invention encompasses any novel feature and any combination of features, including in particular any mutual combination of individual features from the various claims or exemplary embodiments, even if that feature or combination itself is not explictly mentioned in the claims or exemplary embodiments.

The invention claimed is:

1. An optoelectronic component comprising a body, which is suitable for emitting electromagnetic radiation when said component is in operation, which includes a carrier substrate and a radiation emitting layer sequence disposed on said carrier substrate, and which is disposed in a reflector cup of a component housing and is electrically conductively connected to external electrical leads of said component housing wherein said reflector cup includes:
    a reflector region with an inner surface whose cross section increases as viewed from said radiation emitting body to a front side of said component housing, such that radiation coming from said layer sequence and striking said inner surface is deflected specifically to a desired optical axis of said component, and
    a substrate trough, which is disposed upstream on the floor side of said reflector region and in which said radiation emitting body is arranged, the depth of said substrate trough being so selected that said carrier substrate is at least partially sunken relative to said reflector region and the length and the width of said substrate trough being so adapted to the length and the width of said body that only minuscule gaps exist between flanks of said body and said substrate trough.

2. The component as in claim 1 wherein said component housing comprises a lens through which said optical axis passes and which has its smallest radius of curvature in the region where said optical axis intersects the surface of said lens, said radius of curvature increasing steadily with increasing distance from said optical axis.

3. The component as in claim 2 wherein said lens is a Fresnel lens.

4. The component as in claim 2 wherein said lens is an aspherical lens having the shape of an ellipsoid segment.

5. The component as in claim 2 wherein said lens comprises a non-rotationally-symmetrical ellipsoid segment.

6. The component as in claim 1 wherein side walls of said substrate trough form an angle $\beta$ of about 1° with the normals to a floor surface of said substrate trough.

7. The component as in claim 2 wherein said component housing includes a pedestal region on which said lens is mounted.

8. The component as in claim 7 wherein said lens passes tangentially into said pedestal region.

9. The component as in claim 7 wherein said lens is set back with respect to said pedestal region, such that a shoulder is formed.

10. The component as in claim 1 wherein said inner surface of said reflector region comprises a layer that increases the reflectivity of said inner surface.

11. The component as in claim 10 wherein said layer comprises silver.

12. The component as in claim 1 wherein said inner surface of said reflector region is configured as parabolic, truncated-cone-shaped or spherical.

13. The use of a component as in claim 1 wherein it is used in a computer mouse, a light barrier or a printer.

14. A component housing for a radiation-emitting body, wherein a reflector cup is provided, comprising:
    a reflector region with an inner surface whose cross section increases in the direction of a front side of said component housing, such that radiation striking said inner surface is deflected to a desired optical axis, and
    a substrate trough, which is disposed upstream on the floor side of said reflector region and serves to receive said radiation emitting body, the depth of said substrate trough being so selected that a carrier substrate of said radiation emitting body is at least partially sunken relative to said reflector region and the length and the width of said substrate trough being so adapted to the length and the width of said body that only minuscule gaps exist between the flanks of said body and said substrate trough,
    wherein:
    the substrate trough comprises a deep-set floor configured to receive the carrier substrate, and side walls of the substrate trough completely surround lateral surfaces of the substrate when the substrate is received in the deep-set floor; and
    the side walls of the substrate trough form a first angle with respect to the deep-set floor, and the inner surface of the reflector region forms a second angle with respect to the deep-set floor that is different from the first angle.

15. The component housing as in claim 14 wherein it comprises a lens through which said optical axis passes and which has its smallest radius of curvature in the region where said optical axis intersects the surface of said lens, said radius of curvature increasing steadily with increasing distance from said optical axis.

16. The component housing as in claim 15 wherein said lens is a Fresnel lens.

17. The component housing as in claim 15, wherein said lens is an aspherical lens having the shape of an ellipsoid segment.

18. The component housing as in claim 15 wherein said lens comprises a non-rotationally-symmetrical ellipsoid segment.

19. The component housing as in claim 14 wherein side walls of said substrate trough form an angle $\beta$ of about 1° with the normals to a floor surface of said substrate trough.

20. The component housing as in claim 15 wherein it includes a pedestal region on which said lens is mounted.

21. The component housing as in claim 20 wherein said lens passes tangentially into said pedestal region.

22. The component housing as in claim 20 wherein said lens is set back with respect to said pedestal region, such that a shoulder is formed.

23. The component housing as in claim 14 wherein said inner surface of said reflector region is configured as parabolic, truncated-cone-shaped or spherical.

24. The component housing as in claim 14 wherein said inner surface of said reflector region comprises a layer that increases the reflectivity of said inner surface.

25. The component housing as in claim 24 wherein said layer comprises silver.

26. The component as in claim 1 wherein a distance between side walls of the substrate trough and at least a portion of the flanks of the body is between 0.05 mm and 0.3 mm.

27. The component as in claim 1 wherein:
the carrier substrate is positioned on a deep-set floor of the substrate trough;
side walls of the substrate trough completely surround lateral surfaces of the substrate; and
the side walls of the substrate trough form a first angle with respect to the deep-set floor, and the inner surface of the reflector region forms a second angle with respect to the deep-set floor that is different from the first angle.

28. The component as in claim 1 wherein the radiation emitting layer sequence is disposed on a surface of the carrier substrate that defines a plane, and wherein the substrate trough and the reflector region intersect at positions within the plane.

* * * * *

UNITED STATES PATENT AND TRADEMARK OFFICE
CERTIFICATE OF CORRECTION

PATENT NO. : 7,897,977 B2  
APPLICATION NO. : 11/577526  
DATED : March 1, 2011  
INVENTOR(S) : Mike Börner et al.

Page 1 of 1

It is certified that error appears in the above-identified patent and that said Letters Patent is hereby corrected as shown below:

Title Page  
Column 2, Other Publications, Ishinaga Reference,
   line 4, delete "the Devce" and insert --the Device--

Column 1  
Lines 15-16, delete "Electromagnetic radiation emiting semiconductor component and component housing."

Signed and Sealed this  
Tenth Day of May, 2011

David J. Kappos  
*Director of the United States Patent and Trademark Office*